(12) United States Patent
Koh

(10) Patent No.: US 7,183,609 B2
(45) Date of Patent: Feb. 27, 2007

(54) SEMICONDUCTOR DEVICES AND METHODS FOR FABRICATING THE SAME

(75) Inventor: Kwan Joo Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,643

(22) Filed: Dec. 29, 2004

(65) Prior Publication Data
US 2005/0139910 A1    Jun. 30, 2005

(30) Foreign Application Priority Data
Dec. 30, 2003    (KR) .................... 10-2003-0100726

(51) Int. Cl.
H01L 29/76    (2006.01)
H01L 29/94    (2006.01)
H01L 31/00    (2006.01)

(52) U.S. Cl. ........................... 257/330; 257/E29.201; 257/E21.585; 438/182; 438/259; 438/270

(58) Field of Classification Search ................ 257/330
See application file for complete search history.

(56) References Cited

U.S. PATENT DOCUMENTS

| | | | | |
|---|---|---|---|---|
| 5,386,132 A * | 1/1995 | Wong | ......................... | 257/316 |
| 5,920,100 A * | 7/1999 | Wen | .......................... | 257/390 |
| 6,093,606 A * | 7/2000 | Lin et al. | ..................... | 438/259 |
| 6,130,453 A * | 10/2000 | Mei et al. | .................... | 257/315 |
| 6,232,632 B1 * | 5/2001 | Liu | .............................. | 257/315 |
| 2003/0075758 A1 * | 4/2003 | Sundaresan et al. | ......... | 257/329 |

* cited by examiner

Primary Examiner—Evan Pert
Assistant Examiner—Benjamin P. Sandvik
(74) Attorney, Agent, or Firm—Andrew D. Fortney

(57) ABSTRACT

Semiconductor devices and methods for fabricating the same are disclosed. A disclosed method includes forming a trench in a region where a main gate pattern is to be formed, forming an insulating film having a fixed thickness in the trench, and fixing a scale of the main gate pattern filled in the trench with the thickness of the insulating film. The trench elongates a current flow passage formed by a shape of the main gate pattern.

20 Claims, 5 Drawing Sheets

SEMICONDUCTOR DEVICES AND METHODS FOR FABRICATING THE SAME

FIELD OF THE DISCLOSURE

The present disclosure relates generally to semiconductor fabrication and, more particularly, to semiconductor devices and methods for fabricating the same.

BACKGROUND

Recently, semiconductor device integration has rapidly increased toward higher and higher densities. As a result, various geometric structures of the semiconductor device have been subjected to drastic changes.

FIG. 1 illustrates an example prior art side gate type semiconductor device in which a semiconductor substrate 1 is divided by active cell isolation devices 2 (e.g., shallow trench isolation devices) into field regions FR and an active region AR. A transistor 10 for selective switching current flow is located in the active region AR of the semiconductor substrate 1.

The transistor 10 is provided with, for example, a source/drain diffusion layer 15, a main gate pattern 12, a side gate pattern 14, a first gate insulating film 11 for electrically isolating the main gate pattern 12 from the semiconductor substrate 1, and a second gate insulating film 13, for electrically insulating the side gate pattern 14 from the main gate pattern 12 and for electrically insulating the side gate pattern 14 from the semiconductor substrate 1.

In the illustrated prior art side gate type semiconductor device, the scale of the main gate pattern 12 is a very important factor for fixing a size of the completed semiconductor device. If the scale of the main gate pattern 12 is large, the size of the active region AR must also be large, which, in turn, must inevitably make the size of the semiconductor device large, too.

Taking this sensitive situation into account, in the prior art, a precise photo-etching process is performed using a photoresist film pattern to secure micronization of the main gate pattern 12. However, in the prior art photo-etching process, since the photoresist pattern is formed by exposing the photoresist to a UV beam having a non-constant (i.e., variable) wavelength, if no other measure is taken, the profile of the resulting photoresist film pattern necessarily has a large difference from the desired profile. If the process for forming the main gate pattern 12 proceeds in spite of this situation, the resulting main gate pattern 12 cannot achieve a precision as high as the initially set scale. Thus, a simple application of the traditional photo-etching process to micronizing the main gate pattern 12 has many shortcomings.

Furthermore, even if a technology is developed for micronizing the main gate pattern 12 in a manner that meets the recent requirements, there will likely be other difficulties in applying such technology in practice. For instance, if the scale of the main gate pattern 12 is reduced without taking any other measure, the quality of the resulting semiconductor device can become poor due, in large part, to depletion caused by a current flow passage under the main gate pattern 12. (This current flow passage becomes substantially shorter as the scale of the main gate pattern 12 is reduced).

In summary, the problems associated with minimizing the scale of the main gate pattern 12, (e.g., increasing the current flow passage, etc.) create many limitations to substantially improving the quality of semiconductor devices including such gate patterns.

BRIEF DESCRIPTION OF THE DRAWINGS

Wherever possible, the same reference numbers will be used throughout the drawings to refer to the same or like parts.

DETAILED DESCRIPTION

Figure 1:
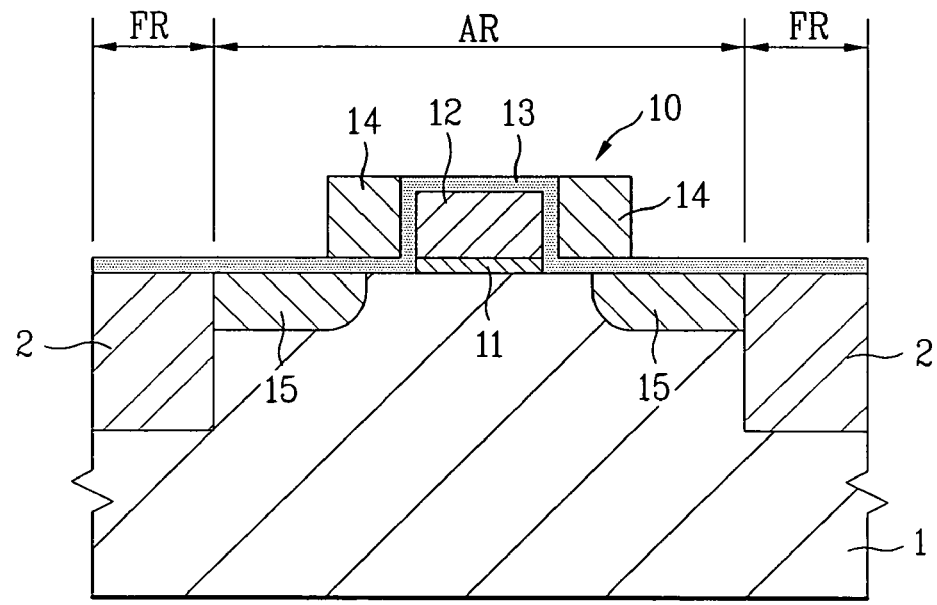
FIG. 1 is a cross-sectional view of an example prior art semiconductor device.
Figure 2:
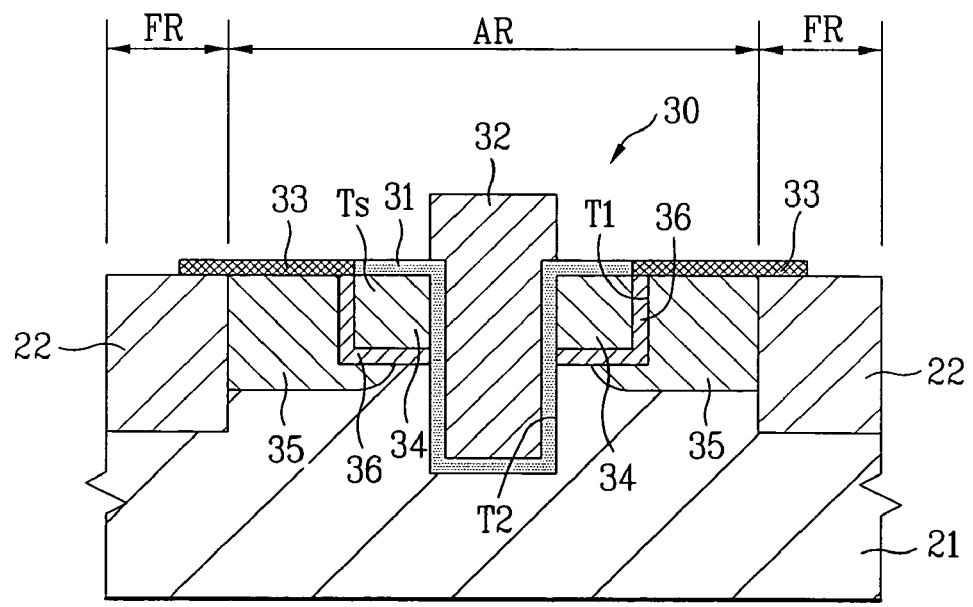
FIG. 2 is a cross-sectional view of an example semiconductor device constructed in accordance with the teachings of the present invention.

FIG. 2 illustrates an example semiconductor device constructed in accordance with the teachings of the present invention. The illustrated example device is a side gate type semiconductor device having a semiconductor substrate 21 divided by active cell isolation films 22 to define field regions FR and an active region AR. A transistor 30 for selective switching current flow is located in the active region AR of the semiconductor substrate 21.

The illustrated transistor 30 includes an upper trench T1 in the active region AR of the semiconductor substrate 21 and a lower trench T2 in a bottom of the upper trench T1. The lower trench T2 is in communication with the upper trench T1 and is formed without disturbing the corner surfaces Ts of the upper trench T1. The transistor 30 also includes a side gate pattern 34 on the corner surfaces Ts of the upper trench T1, a first insulating film 36 on a surface of the upper trench T1 for electrically insulating the side gate pattern 34 from the substrate 21, a main gate pattern 32 selectively filled in spaces of the upper and lower trenches T1, T2, a second insulating film 31 on surfaces of the upper and lower trenches T1, T2 to cover the side gate pattern 34, to electrically insulate the main gate pattern 32 from the semiconductor substrate 21 and to electrically insulate the main gate pattern 32 from the side gate pattern 34, and a passivation film 33 selectively covering exposed portions of the semiconductor substrate 21 to protect the semiconductor substrate 21 during subsequent processes. Source/drain diffusion layers 35 are located on opposite sides of the side gate pattern 34.

The second insulating film 31 of the illustrated example has a fixed thickness which effectively defines the space sizes of the upper and lower trenches T1, T2. If the thickness of the second insulating film 31 is increased, the effective space size of the upper and lower trenches T1, T2 is decreased by an amount corresponding to the increase in the thickness of the second insulating film 31. If the thickness of the second insulating film 31 is reduced, the effective space size of the upper and lower trenches T1, T2 is increased by an amount corresponding to the decrease in the thickness of the second insulating film 31.

Since the effective space size of the upper and lower trenches T1, T2 is dependent on the thickness of the second insulating film 31; the scale of the main gate pattern 32 in the upper and lower trenches T1, T2 is also dependent on the thickness of the second insulating film. 31. That is, if the second insulating film 31 becomes thicker, the scale of the main gate pattern 32 located in the upper and lower trenches T1, T2 can become relatively reduced (e.g., micronized), and if the second insulating film 31 becomes thinner, the scale of the main gate pattern 32 located in the upper and lower trenches T1, T2 can become relatively larger. Thus, the scale of the main gate pattern 32 is completed freed from the limitations of the photo-etching process, thereby enabling the scale of the main gate pattern 32 to be defined by adjusting the second insulating film 31.

In the prior art discussed above, because the main gate pattern is patterned by a photo-etching process with a UV beam having a variable wavelength, producing a micronized scale which meets recent requirements has not been possible.

However, because the upper and lower trenches T1, T2 of the example of FIG. 2 are formed in a region where the main gate pattern 32 is to be formed, and because the second insulating film 31 is formed with a fixed thickness in the upper and lower trenches T1, T2, the scale of the main gate pattern 32 in the upper and lower trenches T1, T2 is naturally fixed by the thickness of the second insulating film 31. Consequently, the main gate pattern 32 of the illustrated example is completed freed from the limitations of the photo-etching process, thereby securely achieving an optimum micronizing scale. Moreover, because the optimum micronized scale of the main gate pattern 32 can be formed securely by using the above described measures, the resulting semiconductor device can also meet the recent high density device packing requirements with flexibility.

As described above, in the prior art situation, if no corrective measure is taken when the scale of the main gate pattern 32 is reduced, the current flow passage under the main gate pattern 32 will inevitably become substantially shorter, thereby resulting in depletion of the main gate pattern 32 and, thus, a poor quality semiconductor device.

In the example of FIG. 2, this sensitive situation is addressed by first forming the upper and lower trenches T1, T2 in the active region of the semiconductor substrate, and then filling the upper and lower trenches T1, T2 with the main gate pattern 32. In this approach, the current flow passage can be naturally elongated by as much as the depths of the trenches T1, T2 due to the shape of the main gate pattern 32. Consequently, the completed main gate pattern 32 can maintain the optimum micronizing scale without suffering depletion.

Figure 3A:
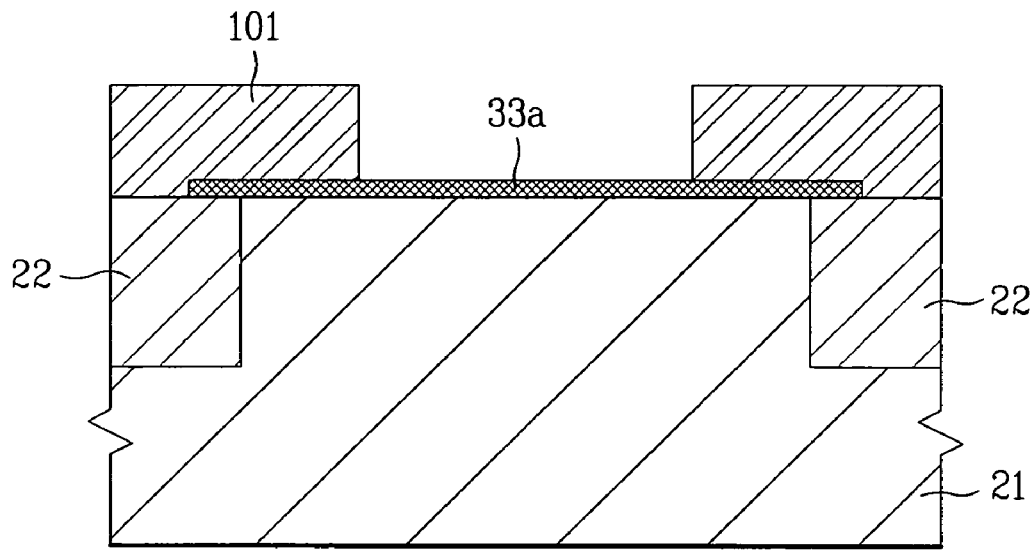
FIGS. 3A~3H are cross-sectional views illustrating an example method for fabricating a semiconductor device performed in accordance with the teachings of the present invention.

An example method for fabricating the foregoing semiconductor device will now be described. Referring to FIG. 3A, an STI process (Shallow Trench Isolation process), a LOCOS process (Local Oxidation of Silicon process), or the like is selectively performed to form active cell isolation films 22 defining an active region AR of a semiconductor substrate 21.

Next, a thermal oxidation process is performed to form an oxide film 33a on the active region AR of the semiconductor substrate 21. A photoresist film pattern 101 is then formed on the semiconductor substrate 21 for selective patterning of the oxide film 33a.

Figure 3B:
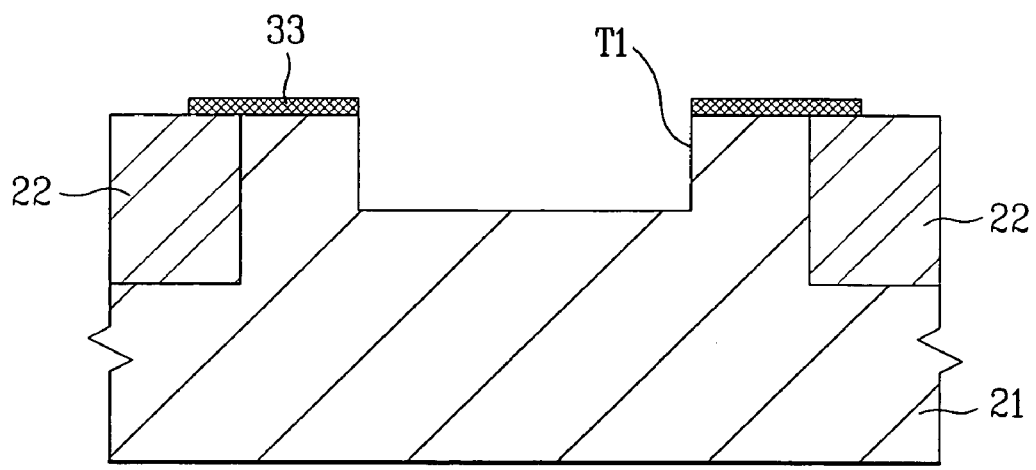

Referring to FIG. 3B, an etching process is performed to form a passivation film 33 on the semiconductor substrate 21. The passivation film 33 of the illustrated example exposes the active region AR. The semiconductor substrate is etched to form an upper trench T1 in the active region. In the illustrated example, the upper trench T1 is preferably formed to a thickness of about 500 Å~2000 Å. Next, the photoresist pattern 101 is removed from the semiconductor substrate 21.

Figure 3C:
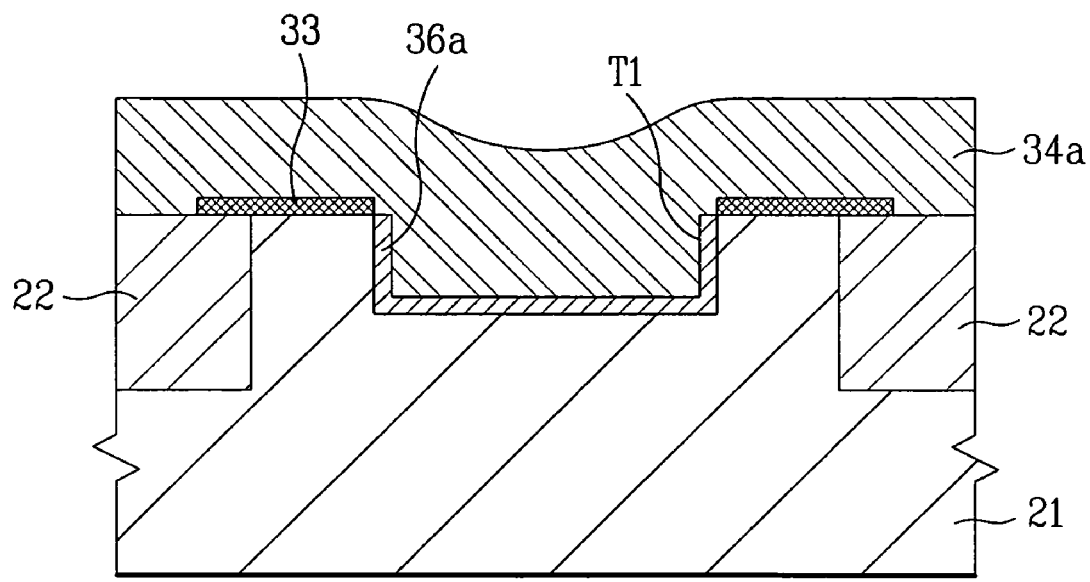

Referring to FIG. 3C, a thermal oxidation process is performed to form an oxide film 36a on a surface of the trench T1 for a first insulating film 36. The passivation film prevents the oxide film 36a from unnecessarily growing in regions other than the upper trench T1.

Figure 3D:
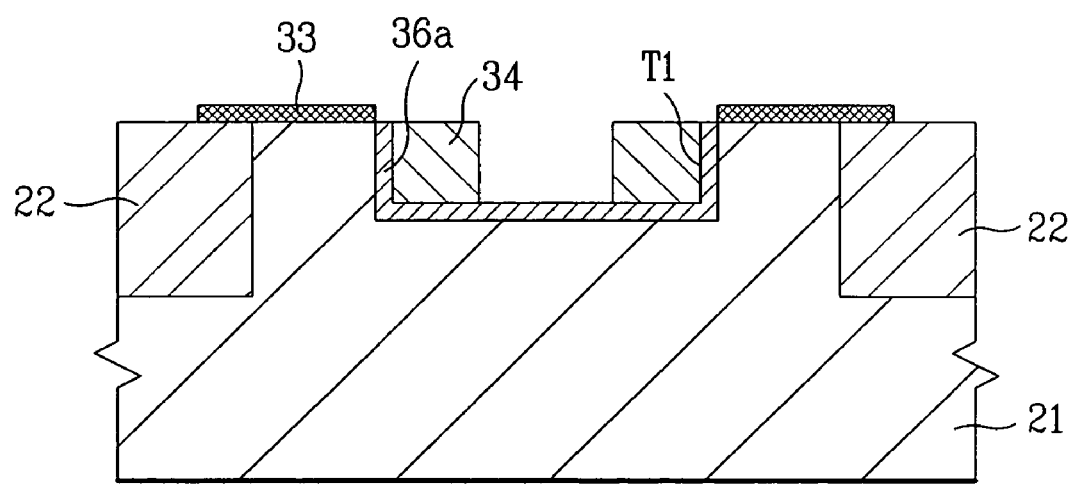

After completing the formation of the upper trench T1 and the oxide film 36a, a deposition process is performed to form a polysilicon layer 34a on the entire surface of the semiconductor substrate 21 inclusive of the passivation film 33. In the illustrated example, the polysilicon layer 34a is preferably formed to a thickness in a range of about 500 Å~2000 Å. The polysilicon layer 34a is then etched by an etch back process, (for example, by a reactive ion etching process), to form a pair of side gate patterns 34 on opposite corner surfaces Ts of the upper trench T1. As shown in FIG. 3D, the side gate patterns 34 are spaced a distance apart from each other.

Figure 3E:
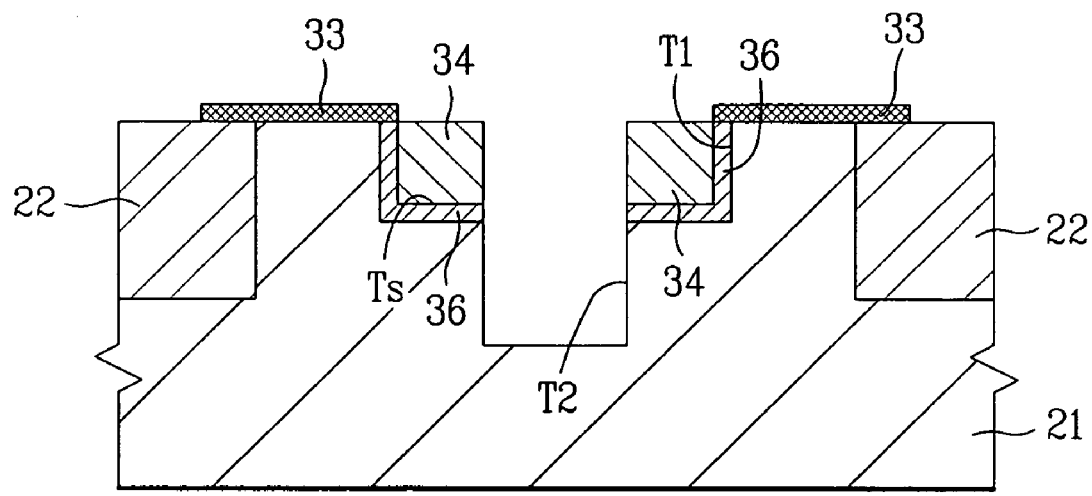
Figure 3F:
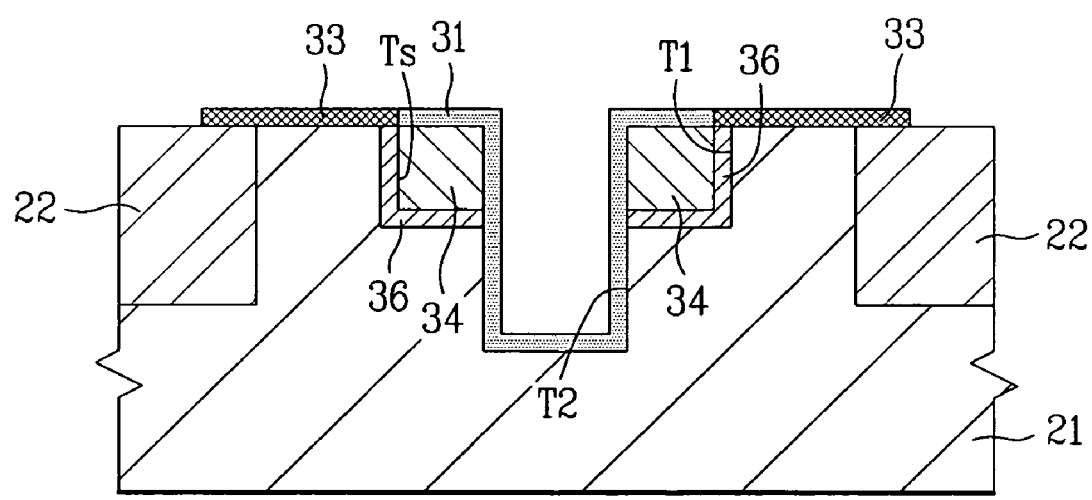

Referring to FIG. 3E, a dry etching process, such as a reactive ion etch process, is then performed to form a lower trench T2 in a bottom of the upper trench T1. The lower trench T2 is in communication with the upper trench T1. The side gate patterns 34 remain on the corner surfaces Ts of the upper trench T1. In the illustrated example, an upper size of the lower trench T2 corresponds to the space separating the side gate pattern 34.

A portion of the oxide film 36 is removed from the bottom of the upper trench T1 when forming the lower trench T2. Consequently, the first insulating film 36 remains only on the corner surfaces Ts of the upper trench T1. The first insulating film 36 electrically insulates the side gate electrodes 34 from the semiconductor substrate 21.

Then, a thermal oxidation process is performed so that silicon atoms at the surfaces of the lower trench T2 and the side gate patterns 34 react with oxygen gas to form a second insulating film 31 on the surfaces of the lower trench T2 and the side gate electrodes 34. By adjusting the parameters of the thermal oxidation process, the thickness of the second insulating film 31 can be flexibly adjusted. In the illustrated example, the parameters are adjusted to form the thickness of the second insulating film to a desired amount. As mentioned above, the effective space scale of the upper and lower trenches T1, T2 becomes smaller as the thickness of the second insulating film 31 is increased.

Figure 3G:
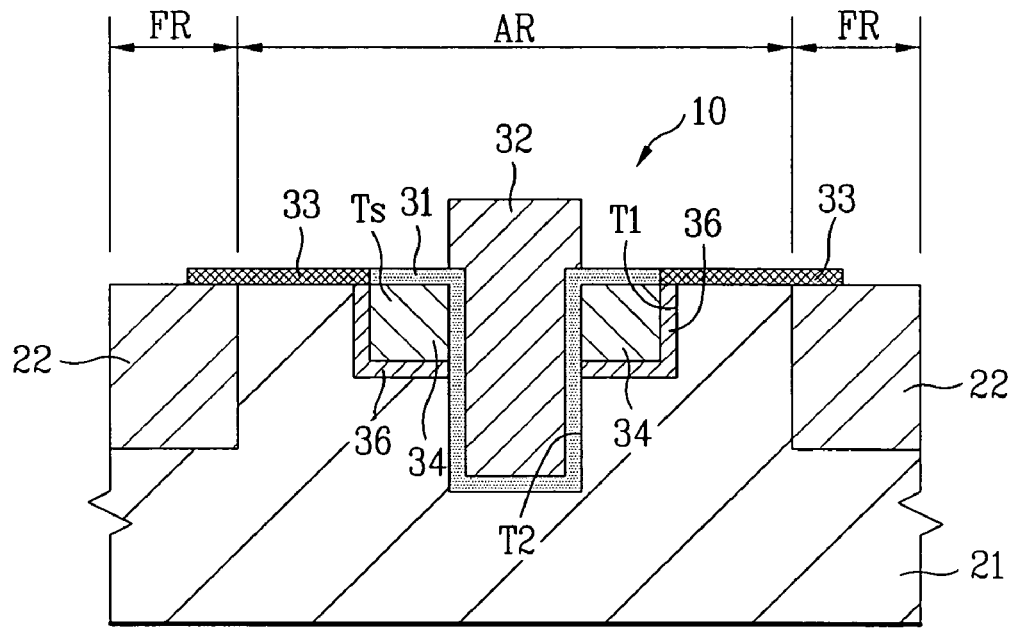

Referring to FIG. 3G, a polysilicon layer is formed on the passivation film 33 to fill the upper and lower trenches T1, T2. This polysilicon layer is subjected to selective etching to form a main gate pattern 32 which covers portions of the second insulating film 31 and fills the upper and lower trenches T1, T2.

Because the effective space scale of the upper and lower trenches T1, T2 is smaller due to the thickness increase of the second insulating film 31, the main gate pattern 32 filling the upper and lower trenches T1, T2 of the illustrated example is freed from the limitations of the photo-etching process, to thereby maintain its scale to a micronite state.

Figure 3H:
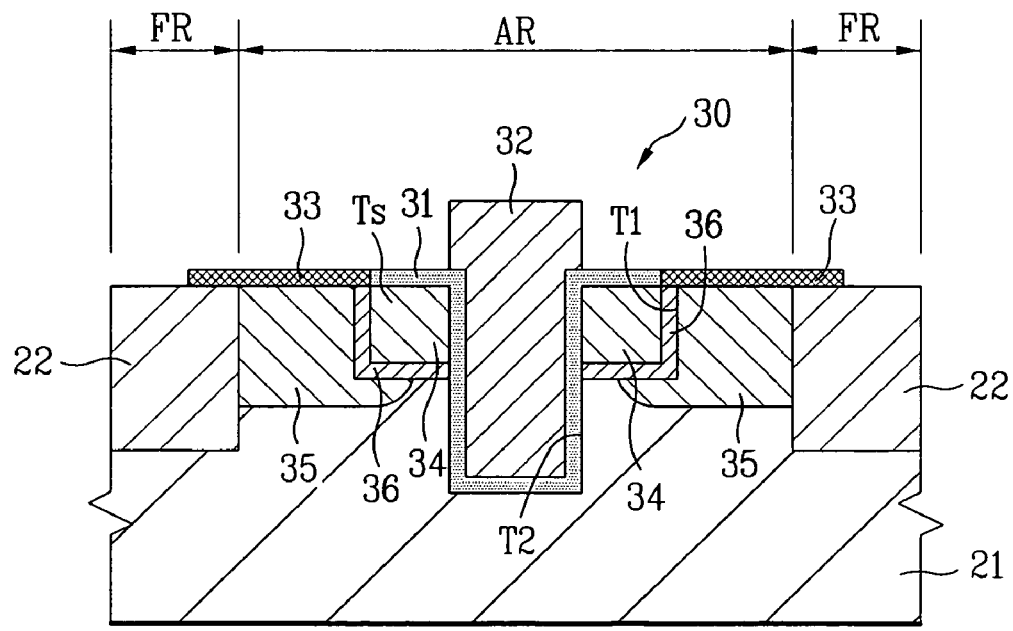

Referring to FIG. 3H, after a conventional impurity ion injection process is performed to form source/drain diffusion layers 35 on opposite sides of the side gate patterns 34, a conventional interlayer insulating film forming process, a conventional contact hole forming process, a conventional metal wiring process, and so on are performed to complete the fabrication of the semiconductor device.

From the foregoing, persons of ordinary skill in the art will appreciate that, by forming a trench in a region where the main gate pattern is to be formed, and by forming an insulating film with a fixed thickness in the trench to fix a scale of the main gate pattern, the main gate pattern is completed without suffering from the limitations of the photo-etching process described in the background section above. As a result, an optimum micronizing scale is securely achieved.

By forming a trench in a region where the main gate pattern is to be formed, and by filling the trench with the main gate pattern, the current flow passage formed by the shape of the main gate pattern is elongated by as much as the depth of the trench. Consequently, the completed main gate pattern can achieve an optimum micronizing scale without causing depletion.

If the current flow passage increases while the main gate pattern scale is minimized due to the above-described trench formation T1, T2, formation of the insulating film, and burial of the main gate pattern, the quality of the resulting semiconductor device may be improved.

From the foregoing, persons of ordinary skill in the art will appreciate that semiconductor devices and methods for fabricating the same have been disclosed, in which a trench is formed in a region where a main gate pattern is to be formed, and an insulating film having a fixed thickness is formed in the trench to fix a scale of the main gate pattern filling the trench. As a result, the completed main gate pattern is free from the limitations of the prior art photo-etching process, thereby achieving an optimum micronizing scale.

Persons of ordinary skill in the art will further appreciate that semiconductor devices and methods for fabricating the same have been disclosed, in which an elongated trench is filled with a main gate pattern to elongate a current flow passage formed by the shape of the main gate pattern by an amount corresponding to the depth of the trench.

From the foregoing, persons of ordinary skill in the art will further appreciate that semiconductor devices and methods for fabricating the same have been disclosed, in which a current flow passage is increased while a main gate pattern scale is minimized by forming trenches of desired dimensions, forming an insulating film to control a size of a main gate pattern, and by burying the main gate pattern, to thereby improve the quality of the completed semiconductor device.

A disclosed semiconductor device includes an upper trench in an active region of a semiconductor substrate, a lower trench in a bottom of the upper trench wherein corners of the upper trench are in communication with the lower trench, first insulating films on the corners of the upper trench, side gate patterns on the first insulating films and filling the corners of the upper trench, a second insulating film coated on surfaces of the upper and lower trenches and covering the side gate pattern to define an effective space scale of the upper and lower trenches, and a main gate pattern filling the remainder of the upper, and lower trenches.

A disclosed example method for fabricating a semiconductor device comprises: forming an upper trench in an active region of a semiconductor substrate, forming a first insulating film on an inside surface of the upper trench, forming a side gate patterns spaced a distance from each other on opposite side corners of the upper trench, forming a lower trench in a bottom of the upper trench in communication with a space between the side gate patterns such that the lower trench is in communication with the upper trench, forming a second insulating film on surfaces of the lower trench and the side gate patterns, and filling the upper and lower trenches with a main gate pattern.

It is noted that this patent claims priority from Korean Patent Application Serial Number P2003-0100726, which was filed on Dec. 30, 2003, and is hereby incorporated in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A semiconductor device comprising:
    isolation films in the substrate on opposite sides of an active region;
    an upper trench in the active region of a semiconductor substrate;
    a lower trench in a bottom of the upper trench, the lower trench being in communication with the upper trench;
    a first insulating film on corner surface of the upper trench;
    side gate patterns in corners of the upper trench adjacent the first insulating film;
    a second insulating film consisting essentially of a thermal oxide on the lower trench and the side gate patterns, to define an effective space scale of the upper and lower trenches;
    a main gate pattern adjacent the second insulating film within the upper and lower trenches; and
    source and drain diffusion layers in the substrate on opposite sides of the side gate patterns and isolated from adjacent devices by the isolation films.

2. A method for fabricating a semiconductor device comprising:
    forming isolation films on opposite sides of an active region;
    forming an upper trench in the active region of a semiconductor substrate;
    forming a first insulating film on an inside surface of the upper trench;
    filling the upper trench with a side gate raw material layer;
    etching back the side gate raw material layer to form side gate patterns spaced a distance away from each other in opposite side corners of the upper trench;
    forming a lower trench in a bottom of the upper trench between the side gate patterns such that the lower trench is in communication with the lower trench;
    forming a second insulating film consisting essentially of an oxide film formed by a thermal oxidation process on surfaces of the lower trench and the side gate patterns;
    filling a volume defined by the second insulating film with a main gate pattern; and
    forming source and drain diffusion layers on opposite sides of the side gate patterns isolated from adjacent devices by the isolation films.

3. A method as claimed in claim 2, wherein the upper trench has a depth of about 500 Å~2000 Å

4. A method as claimed in claim 2, wherein the side gate raw material layer has a thickness of about 500 Å~2000 Å.

5. A semiconductor device comprising:
    isolation films in the substrate on opposite sides of an active region;
    a trench defined in the active region of a semiconductor substrate, the trench having a T-shaped cross-section with a stem portion and a cross portion;
    side gate patterns in opposite corners of the cross portion of the trench;
    an insulating film consisting essentially of a thermal oxide on internal surfaces of the stem portion of the wench and on the side gate patterns to define a space;
    a main gate pattern substantially filling the space defined by the insulating film; and source and drain diffusion layers in the substrate on opposite sides of the side gate patterns and isolated from adjacent devices by the isolation films.

6. A method for fabricating a semiconductor device comprising:
  forming isolation films on opposite sides of an active region;
  forming a trench in the active region of a semiconductor substrate, the trench having an elongated, vertically oriented portion;
  etching back a raw material layer to form side gate patterns in opposite side corners of an upper portion of the trench;
  coating an insulating film consisting essentially of an oxide film formed by a thermal oxidation process on surfaces of the elongated, vertically oriented portion;
  forming an elongated main gate by filling the elongated, vertically oriented portion with polysilicon to define an elongated current flow passage around the main gate; and
  forming source and drain diffusion layers on opposite sides of the side gate patterns isolated from adjacent devices by the isolation films.

7. The semiconductor device of claim 1, wherein the first insulating film comprises a thermal oxide.

8. The method as claimed in claim 2, wherein forming the first insulating film comprises a thermal oxidation process.

9. The semiconductor device of claim 1, further comprising a thermal oxide over the source and drain diffusion layers.

10. The method as claimed in claim 2, further comprising forming a thermal oxide over the semiconductor substrate prior to forming the upper trench.

11. The method as claimed in claim 2, wherein forming the lower trench comprises a reactive ion etch process.

12. The semiconductor device of claim 1, wherein the side gate patterns comprise polysilicon.

13. The semiconductor device of claim 1, wherein the main gate pattern comprises polysilicon.

14. The method as claimed in claim 2, wherein forming the main gate pattern comprises depositing a polysilicon layer.

15. The method as claimed in claim 14, wherein forming the main gate pattern comprises etching the polysilicon layer.

16. The method as claimed in claim 2, wherein forming isolation films comprises either a shallow trench isolation process or a LOCOS process.

17. The device of claim 1, wherein the second insulating film electrically insulates the side gate patterns from the main gate pattern.

18. The method as claimed in claim 2, wherein the second insulating film electrically insulates the side gate patterns from the main gate pattern.

19. The method as claimed in claim 2, wherein varying the thickness of the second insulating film adjusts a thickness of a portion of the main gate pattern located in the lower trench.

20. The device of claim 1, wherein a bottom surface of the main gate pattern is substantially deeper in the semiconductor substrate than the side gate patterns and the source and drain diffusion regions.

* * * * *